(12) United States Patent
Huisinga et al.

(10) Patent No.: US 8,786,088 B2
(45) Date of Patent: Jul. 22, 2014

(54) SEMICONDUCTOR DEVICE INCLUDING ULTRA LOW-K (ULK) METALLIZATION STACKS WITH REDUCED CHIP-PACKAGE INTERACTION

(75) Inventors: Torsten Huisinga, Dresden (DE); Jens Heinrich, Wachau (DE); Kai Frohberg, Niederau (DE); Frank Feustel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 741 days.

(21) Appl. No.: 12/966,302

(22) Filed: Dec. 13, 2010

(65) Prior Publication Data

US 2012/0001323 A1   Jan. 5, 2012

(30) Foreign Application Priority Data

Jun. 30, 2010   (DE) .......................... 10 2010 030 759

(51) Int. Cl.
*H01L 23/48*   (2006.01)
*H01L 23/522*   (2006.01)
*H01L 21/768*   (2006.01)
*H01L 23/532*   (2006.01)

(52) U.S. Cl.
CPC ...... *H01L 23/53295* (2013.01); *H01L 23/5226* (2013.01); *H01L 2221/1036* (2013.01); *H01L 21/76807* (2013.01); *H01L 23/53238* (2013.01); *H01L 2221/1031* (2013.01); *H01L 21/76801* (2013.01); *H01L 21/76808* (2013.01); *H01L 23/5329* (2013.01)
USPC ............................. 257/758; 257/759; 257/760

(58) Field of Classification Search
USPC ................................................. 257/758–760
See application file for complete search history.

(56) References Cited

U.S. PATENT DOCUMENTS

| | | | |
|---|---|---|---|
| 5,789,819 A * | 8/1998 | Gnade et al. ................... | 257/759 |
| 8,053,799 B2 * | 11/2011 | Kwon et al. ...................... | 257/98 |
| 2004/0253803 A1 * | 12/2004 | Tomono et al. ................ | 438/614 |
| 2005/0184397 A1 * | 8/2005 | Gates et al. .................... | 257/774 |
| 2005/0242435 A1 | 11/2005 | Werking et al. ................ | 257/737 |
| 2008/0272493 A1 * | 11/2008 | Ko et al. ......................... | 257/760 |
| 2011/0049723 A1 * | 3/2011 | Fayaz et al. .................... | 257/773 |
| 2011/0074018 A1 * | 3/2011 | Fukuda .......................... | 257/737 |
| 2011/0115073 A1 * | 5/2011 | Chen .............................. | 257/737 |
| 2011/0175215 A1 * | 7/2011 | Farooq et al. ................. | 257/686 |
| 2012/0028458 A1 * | 2/2012 | Cabral et al. .................. | 438/623 |

FOREIGN PATENT DOCUMENTS

DE   102004021261 A1   11/2005   ............. H01L 25/30

OTHER PUBLICATIONS

Translation of Official Communication from German Patent Office for German Patent Application No. 10 2010 030 759.9 dated Feb. 15, 2011.

\* cited by examiner

*Primary Examiner* — James Mitchell
(74) *Attorney, Agent, or Firm* — Amerson Law Firm, PLLC

(57) ABSTRACT

In complex semiconductor devices, sophisticated ULK materials may be used in metal line layers in combination with a via layer of enhanced mechanical stability by increasing the amount of dielectric material of superior mechanical strength. Due to the superior mechanical stability of the via layers, reflow processes for directly connecting the semiconductor die and a package substrate may be performed on the basis of a lead-free material system without unduly increasing yield losses.

12 Claims, 6 Drawing Sheets

SEMICONDUCTOR DEVICE INCLUDING ULTRA LOW-K (ULK) METALLIZATION STACKS WITH REDUCED CHIP-PACKAGE INTERACTION

BACKGROUND OF THE INVENTION

1. Field of the Invention

Generally, the present disclosure relates to integrated circuits, and, more particularly, to techniques for reducing chip-package interactions caused by thermal mismatch between the chip and the package, in particular during reflowing a bump structure for directly connecting the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield. Additionally, the size of the individual die regions on the wafer is increased in order to integrate more and more circuit portions, even of very different type, thereby achieving very complex integrated circuits executing sophisticated tasks.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with a low-K dielectric material, has become a frequently used alternative in the formation of so-called interconnect structures comprising metal line layers and intermediate via layers that include metal lines as intra-layer connections and vias as inter-layer or vertical connections, which commonly connect individual circuit elements to provide the required functionality of the integrated circuit. Typically, a plurality of metal line layers and via layers stacked on top of each other are necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased, while the conductivity of the lines is reduced due to a reduced cross-sectional area. For this reason, traditional dielectrics, such as silicon dioxide (k>3.6) and silicon nitride (k>5), are replaced by dielectric materials having a lower permittivity, which are, therefore, also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

Due to the reduced mechanical stability of advanced dielectric materials having a dielectric constant of 3.0 and less, device reliability may be affected by the provision of these materials during operation of sophisticated semiconductor devices and in particular during the further processing of the device caused by the interaction between a chip and the package due to a thermal mismatch of the corresponding thermal expansion of the different materials. For instance, in the fabrication of complex integrated circuits, increasingly, a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a bond wire, in the flip chip technology, a respective bump structure may be formed on the last metallization layer, for instance comprised of a solder material which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage devices and the like. During the corresponding process sequence for connecting the bump structure with a package carrier, a certain degree of pressure and/or heat may be applied to the composite device so as to reflow the solder material and establish a reliable connection between each of the bumps formed on the chip and the bumps or pads that may be provided on the package substrate. The thermally or mechanically induced stress may, however, also act on the lower lying metallization layers, which may typically include low-k dielectrics.

Consequently, in sophisticated semiconductor devices, the mechanical characteristics of the low-k dielectric materials have been appropriately adjusted in order to provide the required degree of mechanical stability during the further processing and during the operation of the packaged semiconductor device. Since overall performance of sophisticated semiconductor devices is substantially determined by the signal propagation delay caused by the complex metallization system, great efforts have been made in order to further reduce the parasitic capacitance in the metallization system by further reducing the dielectric constant of the dielectric materials used therein. To this end, so-called ULK (ultra low-k) dielectric materials have been developed, which may typically represent dielectric materials with a porous structure, which may be formed on the basis of lithography techniques or on the basis of process techniques and materials, in which a nano-porous structure may be induced. For example, appropriate species may be incorporated into a base material which may already have a reduced dielectric constant and, upon a subsequent treatment, for instance in the form of a heat treatment, a radiation treatment and the like, a significant portion of the species may be driven out of the base material, thereby producing a random network of pores within the base material, which may thus represent a plurality of randomly distributed "air gaps" in the base material, thereby further reducing the overall dielectric constant. In this manner, the dielectric constant may be reduced to values of 2.7 and less, which may translate into superior electrical performance of the metallization system. In this respect, it should be appreciated that the dielectric constant of dielectric materials may be estimated on the basis of well-established measurement techniques, for instance by forming an appropriate capacitive structure on any test substrates or test regions and measuring the electrical response of the capacitive structure to an electrical stimulus. From the corresponding electrical response, the dielectric constant of the dielectric material may be readily determined. Similarly, a dielectric constant value may be associated with a certain dielectric material by determining its material composition, including the degree of porosity, and measuring the dielectric constant for any appropriate capacitive structure using the material composition of interest. It should be noted that any values for a dielectric constant may thus be understood as referring to a certain measurement strategy, wherein, typically, the corresponding measurement results for the dielectric constant may vary by less than 2-5 percent. In this sense, a value for the dielectric constant of 2.7 may thus enclose a variation within the above-specified range due to a difference in measurement strategies.

The introduction of ULK dielectric materials or porous dielectric materials into the metallization system of sophisticated semiconductor devices, however, may be associated with a further reduction of the mechanical stability of the complex metallization systems, which may thus require a precise balance between electrical performance and mechanical strength of the metallization system. In most recent developments, the continuous shrinkage of critical dimensions for the individual semiconductor-based circuit elements, such as field effect transistors and the like, has brought about an even further increased packing density, thereby providing the possibility to integrate more and more functions into a single semiconductor die. Furthermore, due to advances in process tool technology and the like, and due to the demand for providing semiconductor chips having incorporated therein more and more functional circuit portions, the die size has been increased, thereby requiring very complex metallization systems in which a significant portion of the dielectric material may be provided in the form of ULK or porous dielectric materials. Although the mechanical characteristics and the electrical performance may be the subject of thorough investigations and many process control strategies have been developed to ensure the required reliability of the metallization system, recently, increased yield losses have been observed in combination with advanced direct contact regimes, which may have to be performed on the basis of lead-free solder materials.

With reference to FIGS. 1a-1b, a complex conventional semiconductor device packaged on the basis of a lead-free contact regime will now be described in more detail.

FIG. 1a schematically illustrates a cross-sectional view of a semiconductor device 100 in a packaged state. That is, the semiconductor device 100 comprises a semiconductor die 150 comprising a substrate 151 and a plurality of device levels formed above the substrate 151. As previously explained, the substrate 151 typically represents a silicon material or any other appropriate carrier material for forming thereon semiconductor-based circuit elements, such as transistors and the like. For convenience, any such circuit elements are not shown in FIG. 1a. Furthermore, a metallization system 160 is formed above the substrate 151 and typically comprises a plurality of metal line layers, such as layers 120 and 130, with intermediate via layers, wherein, for convenience, a single via layer 140 is illustrated in FIG. 1a. Furthermore, a contact structure or bump structure 110 is provided above the substrate 151 and may be considered as a part of the metallization system 160. The bump structure 110 comprises an appropriate dielectric material 111 and a bump system 112 comprising a plurality of contact elements or bumps 112A which, as previously indicated, are formed of a lead-free material system. For example, the bump system 112 may be comprised of copper, aluminum, tin, gold, silver and the like, or any appropriate composition of lead-free materials.

Furthermore, the packaged semiconductor device 100 comprises a carrier substrate or package substrate 170, which may have any appropriate configuration and which comprises a complementary contact or bump structure 175 including appropriate contact elements or contact pads 175A that may be directly connected to the respective bump or contact elements 112A of the contact structure 110.

Generally, the packaged semiconductor device 100 may be formed on the basis of appropriate manufacturing strategies for providing circuit elements and the metallization system 160 in accordance with device requirements. In particular, the metallization system 160 is typically provided in the form of sophisticated materials comprising ultra low-k dielectrics, as will be described in more detail with reference to FIG. 1b. Furthermore, as discussed above, with the demand for the integration of more and more functions into the semiconductor die 150, appropriately selected lateral dimensions of the die 150 have to be provided, thereby, however, increasing the probability of creating serious damage, in particular in the metallization system 160, upon connecting the die 150 and the package substrate 170. During a corresponding process, the package substrate 170 and the semiconductor die 150 are mechanically contacted and are heated so as to reflow any solder material, for instance provided in the form of the bumps 112A and/or in the form of the contact elements 175A, so as to form, after solidification of the reflowed solder material, an intermetallic connection between the contact structure 110 and the contact structure 175. Upon using a lead-free contact regime, typically, increased reflow temperatures are required due to the higher melting point of the corresponding lead-free solder materials. Consequently, generally, any temperature gradients, which may be induced during the reflow process, may also be increased. Additionally, the lead-free materials in the contact structures 175, 110 may have an increased degree of stiffness compared to lead-containing solder materials so that any mechanical shear forces created during the reflow process may not be efficiently compensated for or buffered by the lead-free materials in the contact structures 175, 110. Typically, the package substrate 170 may have a significantly greater coefficient of thermal expansion compared to the semiconductor die 150, which may result in a significant deformation of the composite device 100 during the reflow process, in particular during the solidification, when preferably the peripheral contact elements cool down faster compared to the central contact elements. Consequently, the increased overall area of the semiconductor die 150 in combination with increased stiffness of the lead-free contact structures 175, 110 may thus result in increased mechanical stress forces in the metallization system 160. Since a significant part of the metallization system 160 may be comprised of sophisticated ULK materials, such as the material 131 in the metal line layer 130 and the via layer 140, significant shear forces may be transferred into these sensitive material systems. On the other hand, non-porous or mechanically robust dielectric materials, such as layers 141, 142, may preferably be provided in the via layer 140 in combination with the low-k dielectric material 131 so as to obtain increased mechanical stability and also provide chemical resistivity and the like. It should be noted that, according to well-established technical expertise, the via layer 140 may comprise a significant amount of the ultra low-k dielectric material 131 in order to obtain a desired balance between mechanical integrity and overall signal process performance.

FIG. 1b schematically illustrates a portion of the metallization system 160 of the semiconductor die 150 in a more detailed illustration. As shown, a first metal line layer 120 may comprise any appropriate dielectric material 121, such as a porous ULK material, in which metal lines 125 are formed. Moreover, the metal line layer 130 is formed above the metal line layer 120 and is electrically connected thereto by means of the intermediate via layer 140. The layer 130 comprises the ULK material 131 having a porous configuration and includes appropriate metal lines 135, which may be comprised of a conductive barrier material or material system 135A in combination with a core metal 135B. Typically, tantalum and tantalum nitride may be used as efficient barrier materials and the core metal may be provided in the form of copper and the like. As illustrated, the barrier material 135A and the core metal 135B may continuously connect and thus form a via 145 that is thus laterally embedded in the dielectric materials 131, 141 and 142 of the via layer 140.

The metallization system 160 is formed on the basis of the following processes. After completing the metal line layer 120, the dielectric material 142 is deposited, for instance in the form of a nitrogen-containing silicon carbide material and the like, which may provide superior etch stop capabilities and may also act as an efficient copper diffusion blocking layer, if required. However, due to the incorporation of nitrogen, the layer 142 may have a moderately high dielectric constant of approximately 4.5 and higher. Thereafter, a further dielectric material 141, for instance in the form of silicon dioxide formed on the basis of TEOS, may be provided with a dielectric constant of 3.5 and higher, depending on the actual material composition. Thereafter, a dielectric material may be deposited and may be appropriately treated in order to obtain the desired porous state, which may be accomplished on the basis of a plurality of low-k base materials in combination with any substances that may be incorporated into the base material. Consequently, after treating the base material, the low-k dielectric material 131 in the via layer 140 and the metal line layer 130 may be obtained. Thereafter, a complex patterning process is typically performed comprising two lithography processes in order to form etch masks for defining the lateral size and position of the vias 145 and of the metal lines 135. Thereafter, the materials 135A and 135B may be provided on the basis of any appropriate process strategy, followed by the removal of any excess material. In this manner, any further metal lines and intermediate via layers may be provided, wherein at least some of these further layers may have incorporated therein an ultra low-k dielectric material.

In particular, after the reflow process as described with reference to FIG. 1a, significant damage may be observed in the metallization system 160, such as cracks and material delamination, which may result in significant device failures and thus yield losses. It is believed that the large amount of ULK material may significantly reduce the overall mechanical stability while, according to standard technological expertise, a reduction of the amount of ULK material in the metallization system 160 may result in significant loss of performance of the semiconductor die 150.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the mechanical stability of sophisticated metallization systems may be increased, substantially without reducing electrical performance, by reducing the amount of highly critical low-k material and thus increasing the portion of dielectric material of superior mechanical stability within the via level of the metallization system. It has been recognized that severe damage in the metallization system of sophisticated semiconductor die may preferably occur in the via layers upon performing a reflow process on the basis of a lead-free contact regime. It has further been recognized that, contrary to the standard technical opinion, an increase of dielectric material of superior mechanical stability and thus having a greater dielectric constant of the via level may substantially not reduce the overall performance of the metallization system, when still providing a porous or ULK dielectric material in the metal line layers, at least in the very critical metal line layers. Consequently, in some illustrative embodiments disclosed herein, the vias may be laterally embedded in a dielectric material of superior mechanical stability, i.e., the vias may be in contact along their entire height with a dielectric material of increased stability, while the metal lines may still be embedded in the ULK dielectric material. In some illustrative embodiments, the dielectric material of superior stability may be provided as a substantially continuous material layer outside of the vias within the via layer, while, in other cases, isolated material portions may be provided around the vias so that dielectric material of superior mechanical stability may efficiently engage into each other, thereby also providing superior stability of the via layer.

One illustrative semiconductor device disclosed herein comprises a metallization system comprising a metal line layer that is formed above a substrate, wherein the metal line layer comprises a metal line that is laterally embedded in a porous dielectric material. The metallization system further comprises a via layer comprising a via connecting to the metal line, wherein the via is laterally embedded in a non-porous dielectric material along a height of the via. Additionally, the semiconductor device comprises a bump structure configured to be connected to a complementary contact structure of a package substrate by using a lead-free solder material.

A further illustrative semiconductor device disclosed herein comprises a plurality of stacked metal line layers that are formed above a substrate, wherein each metal line layer comprises a plurality of metal lines formed in an ultra low-k dielectric material. The semiconductor device further comprises at least one intermediate via layer located between two of the plurality of stacked metal line layers, wherein the at least one intermediate via layer comprises a metal-containing via formed in a dielectric material, at least a portion of which has a greater dielectric constant than the ultra low-k dielectric material, wherein at least a portion extends a total height of the via. Additionally, the semiconductor device comprises a bump structure comprising contact elements for forming an intermetallic connection with complementary contact elements of a package substrate on the basis of a lead-free contact regime.

One illustrative method disclosed herein relates to forming a semiconductor device. The method comprises forming a plurality of metal line layers above a first substrate, wherein the plurality of metal line layers comprises an ultra low-k dielectric material. The method further comprises forming at least one intermediate via layer so as to comprise vias, each of which is laterally fully embedded in a non-porous dielectric material. The method further comprises performing a reflow process so as to directly connect a contact structure formed above the first substrate to a complementary contact structure formed above a second substrate without using lead material.

BRIEF DESCRIPTION OF THE DRAWINGS

The disclosure may be understood by reference to the following description taken in conjunction with the accompanying drawings, in which like reference numerals identify like elements, and in which.

Figure 1A:
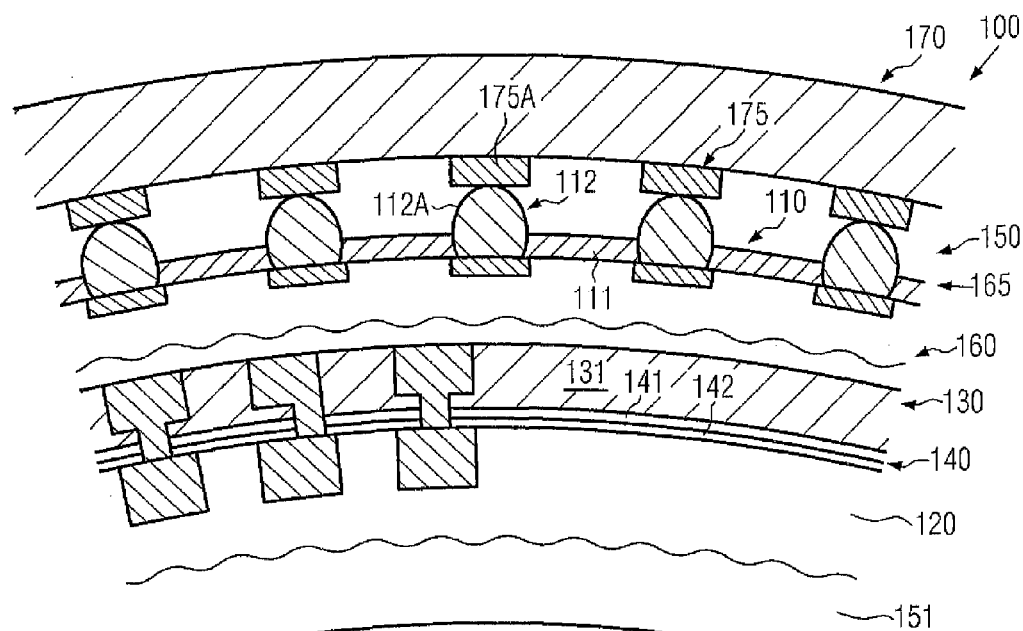
FIG. 1a schematically illustrates a cross-sectional view of a packaged semiconductor device after a reflow process, wherein a sophisticated metallization system comprises a large amount of ULK material, according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which superior stability of a complex metallization system may be achieved by specifically increasing the amount of mechanically robust dielectric material in via layers while preserving the large amount of ULK material in the metal line layers. The principles disclosed herein are based on the findings that, in a complex metallization system comprising porous or ULK dielectric materials in the metal line layers, a degradation of overall performance may be substantially avoided upon increasing the amount of mechanically robust dielectric material in the via layers, since it has been recognized that, in metallization systems comprising ULK materials, in particular the via layers may be subject to pronounced damage upon performing a lead-free reflow process. According to the principles disclosed herein, the overall parasitic capacitance may not significantly increase in various sophisticated metallization systems formed on the basis of ULK materials by incorporating an increased amount of non-porous and thus mechanically stable dielectric materials in the via layer, wherein each of the vias may be efficiently laterally embedded in the dielectric material of superior robustness, thereby enhancing overall mechanical integrity of the ULK metallization system during reflow processes performed on the basis of lead-free material systems, which may have a per se higher degree of stiffness, as discussed above. In some illustrative embodiments, the dielectric material of superior mechanical stability may be provided in the form of isolated material portions, wherein the corresponding intermediate spaces may be filled with a ULK material so that, in total, an increased surface area for connecting the ULK material with the dielectric material of superior mechanical stability may be provided, which thus generally increases the mechanical stability of the via layer and thus of the entire metallization system.

Figure 1B:
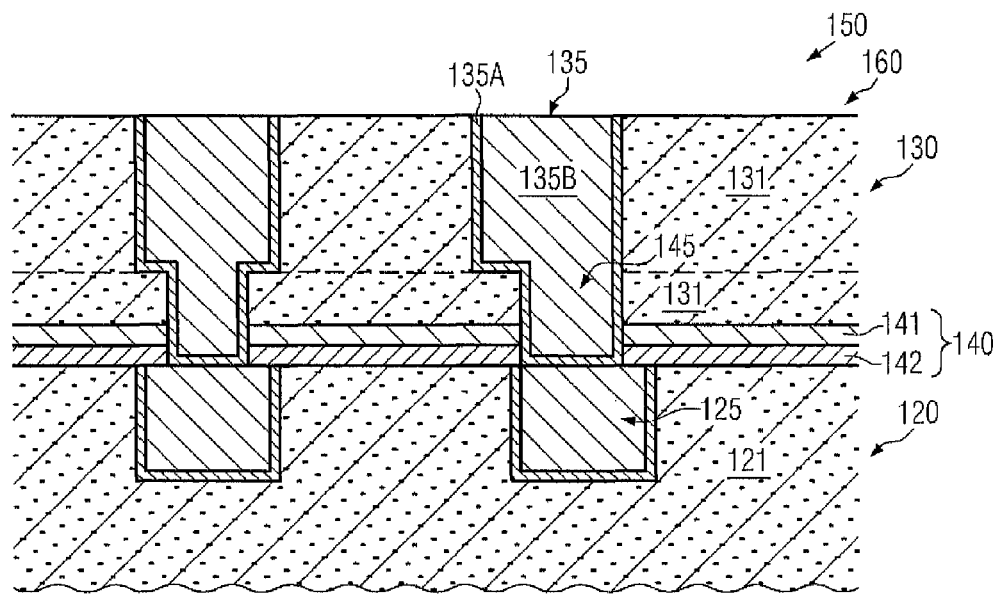
FIG. 1b schematically illustrates a cross-sectional view of a portion of the complex metallization system which may suffer from increased yield losses upon performing a reflow process on the basis of a lead-free contact regime, according to conventional strategies.

With reference to FIGS. 2a-2h, further illustrative embodiments will now be described in more detail, wherein reference may also be made to FIGS. 1a-1b, if appropriate.

Figure 2A:
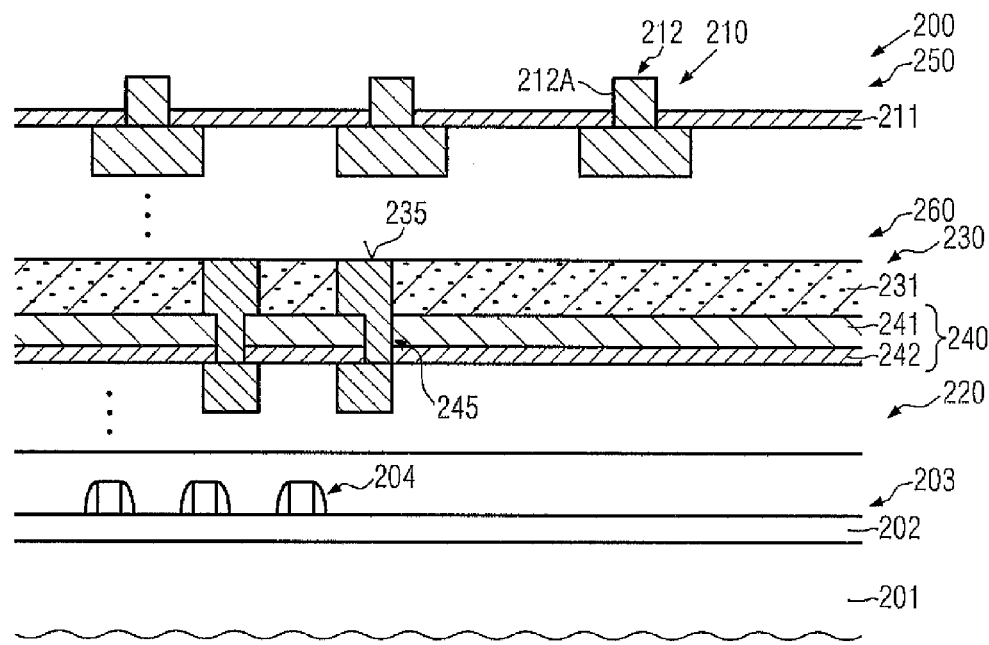
FIGS. 2a-2b schematically illustrate cross-sectional views of a semiconductor device including a complex metallization system having superior mechanical stability, in particular in view of a lead-free contact regime to be applied upon directly connecting the semiconductor die with a package substrate.

FIG. 2a schematically illustrates a cross-sectional view of a semiconductor die 250, which may represent a part of a semiconductor device 200 when connected to a further substrate or package by means of a reflow process to be performed on the basis of a lead-free contact regime, as is also previously described with reference to the semiconductor device 100. In the manufacturing stage shown, the semiconductor die 250 may comprise a substrate 201, such as a silicon substrate, an SOI substrate and the like, above which may be provided a semiconductor layer 202, such as a silicon layer, in and above which circuit elements 204, such as transistors and the like, may be formed. The circuit elements 204 may be embedded in any appropriate dielectric material of a contact level 203, which may also comprise appropriate contact elements (not shown) so as to electrically connect the circuit elements 204 with a metallization system 260. It should be appreciated that the circuit elements 204 may be formed on the basis of critical dimensions of 50 nm and less when sophisticated semiconductor devices are considered. The metallization system 260 may comprise a plurality of metal line layers, such as layers 230, 220, in which metal lines may be formed in a ULK material or porous low-k dielectric material, as is, for instance, shown for the metal line layer 230, which may comprise metal lines 235 and the ULK dielectric material 231. Moreover, a via layer 240 may be provided so as to connect the metal line layer 220 with the metal line layer 230 by means of one or more vias 245, which may be laterally embedded in a dielectric material of superior mechanical stability. In the embodiment shown, a first dielectric material 242 and a second dielectric material 241 may be provided in the via layer 240 and may represent non-porous dielectric materials, for instance in the form of nitrogen-containing silicon-carbide, silicon nitride, silicon dioxide or any combination thereof. Consequently, generally, the material layers 242, 241 may have a dielectric constant of greater than 3.0 and may thus not be considered as any low-k dielectric material. In the embodiment shown, both layers 241 and 242 may be provided in the form of material layers which may be continuous outside of the vias 245, thereby providing a high degree of mechanical stability.

Figure 2B:
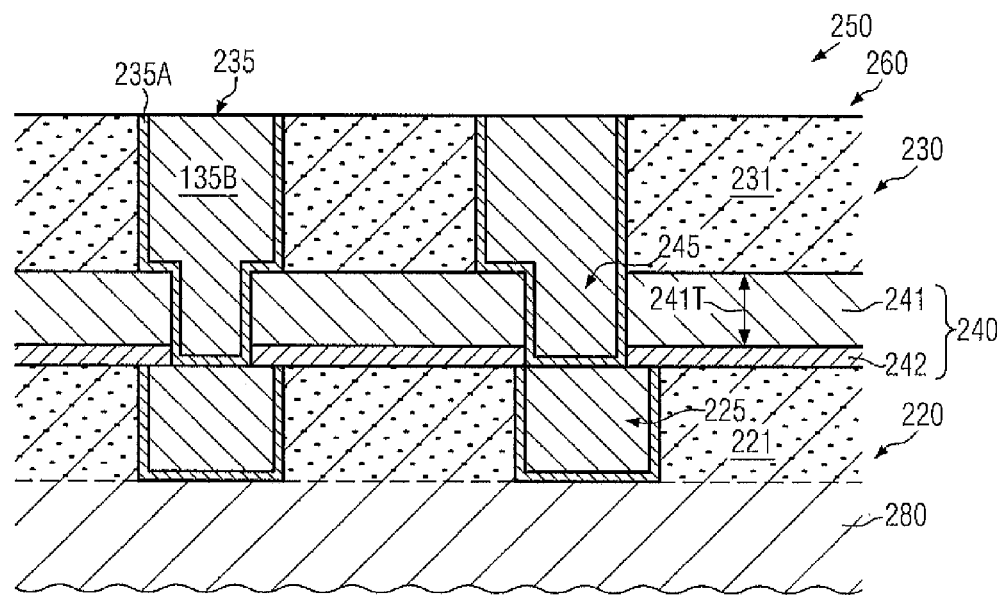

FIG. 2b schematically illustrates an enlarged view of a portion of the metallization system 260 of the semiconductor die 250. As illustrated, the metal line layer 220 may comprise a dielectric material 221 in the form of a ULK or porous dielectric material in which may be provided metal lines 225. If required, a via layer 280 of superior mechanical stability may be formed below the metal line layer 220 and the layer 280 may have a similar configuration, as will be described in more detail with reference to the via layer 240. The layer 240 may comprise the dielectric layer 242, for instance having any appropriate material composition so as to act as an etch stop layer and/or as a capping layer for a metal of the metal lines 225. It should be appreciated that the layer 242 may be comprised of two or more sub-layers in order to obtain in total the desired characteristics in terms of etch stop capabilities, diffusion blocking efficiency and the like. For example, the layer 242 may comprise sub-layers in the form of silicon nitride, nitrogen-containing silicon carbide, silicon dioxide and the like. Moreover, the dielectric layer 241, for instance in the form of TEOS-based silicon dioxide, possibly having incorporated therein any doping species, such as fluorine and the like, may be provided with a thickness 241T which may determine, in combination with the thickness of the layer 242, the height of the vias 245. In this sense, the vias 245 may be laterally fully embedded in the dielectric materials 241 and 242, which represent a non-porous dielectric material having superior mechanical stability and thus a dielectric constant of greater than 3.0.

The semiconductor die 250 as shown in FIGS. 2a and 2b may be formed on the basis of any appropriate process strategy for providing the circuit elements 204 in accordance with design rules and device requirements. Similarly, the contact level 203 may be formed on the basis of any desired process strategy. Thereafter, the metallization system 260 may be formed by providing the metal line layer 220, followed by the via layer 240 and the metal line layer 230. To this end, after completing the layer 220, the dielectric materials 242 and 241 may be applied as continuous material layers followed by the deposition of an appropriate base material for the ULK material 231, which may be subsequently treated in order to adjust the final low dielectric value, as is also discussed above. Next, an appropriate patterning regime may be applied so as to form corresponding openings for the metal lines 235 and the vias 245 followed by any appropriate deposition process sequence and removal processes for obtaining the metal lines 235 as electrically isolated elements. In the embodiment shown, a "dual damascene" strategy may be applied in which the barrier materials and core metals for the metal line 235 and the via 245 may be provided in a common process sequence so that a continuous highly conductive metal may be provided for the metal line 235 and the via 245. It should further be appreciated that, during the patterning of the ULK material 231, the dielectric material 241 may be efficiently used as a stop material since it may have significantly different etch characteristics compared to the ULK material 231. Similarly, upon patterning the layer 241, the material 242 may act as an efficient etch stop material, thereby providing superior process control and thus uniformity of the resulting metal lines and vias 235, 245. Thereafter, any further metal line layers and intermediate via layers may be formed, for instance on the basis of a concept as described with reference to the layers 240, 230, and finally the contact structure or bump structure 210 may be formed on the basis of lead-free materials. As, for example, shown in FIG. 2a, the bump or contact structure 210 may comprise an appropriate dielectric material 211 in combination with a bump or contact system 212 comprising a plurality of individual isolated bumps or contact elements 212A, which may be provided in the form of metal pillars, solder bumps and the like. The contact structure 210 may be formed on the basis of any well-established process strategy and in compliance with the layout criteria for a corresponding complementary contact structure of a package substrate or any other substrate (not shown), as is also previously discussed with reference to the components 170 and 150 in FIG. 1a.

Consequently, upon performing a reflow process for directly connecting the semiconductor die 250 with a package substrate (not shown) based on a lead-free contact regime, the resulting mechanical stress forces may be efficiently accommodated by the metallization system 260 due to the superior mechanical stability of the one or more via layers 240.

Figure 2C:
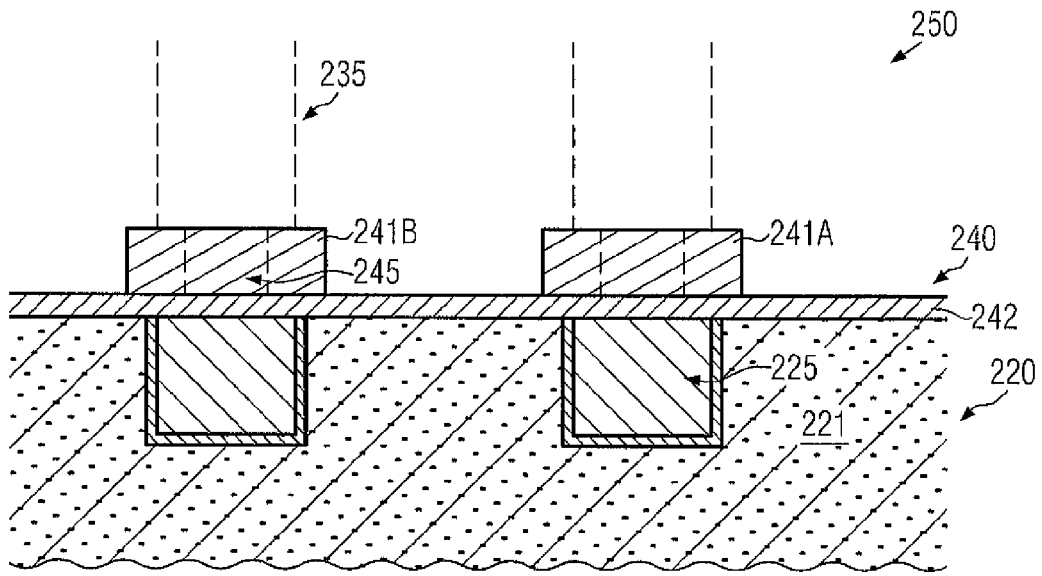
FIGS. 2c-2d schematically illustrate a cross-sectional view and a top view, respectively, of a semiconductor die in a manufacturing phase for forming a via layer on the basis of an increased amount of dielectric material having superior mechanical stability, according to illustrative embodiments.

FIG. 2c schematically illustrates the semiconductor die 250 according to further illustrative embodiments in which the stability of the via layer may be enhanced by providing local material portions, in which the vias may be fully embedded. As illustrated, the via layer 240 may be illustrated in an intermediate manufacturing stage in which the etch stop layer or layers 242 may be provided above the metal line layer 220 and wherein a plurality of "isolated" material portions 241A, 241B may be provided at lateral positions and an appropriate size in order to form therein the vias 245, as indicated by dashed lines. Consequently, the material portions 241A, 241B may also be appropriately aligned to the metal lines 235, as indicated by dashed lines, still to be formed above the via layer 240.

Figure 2D:
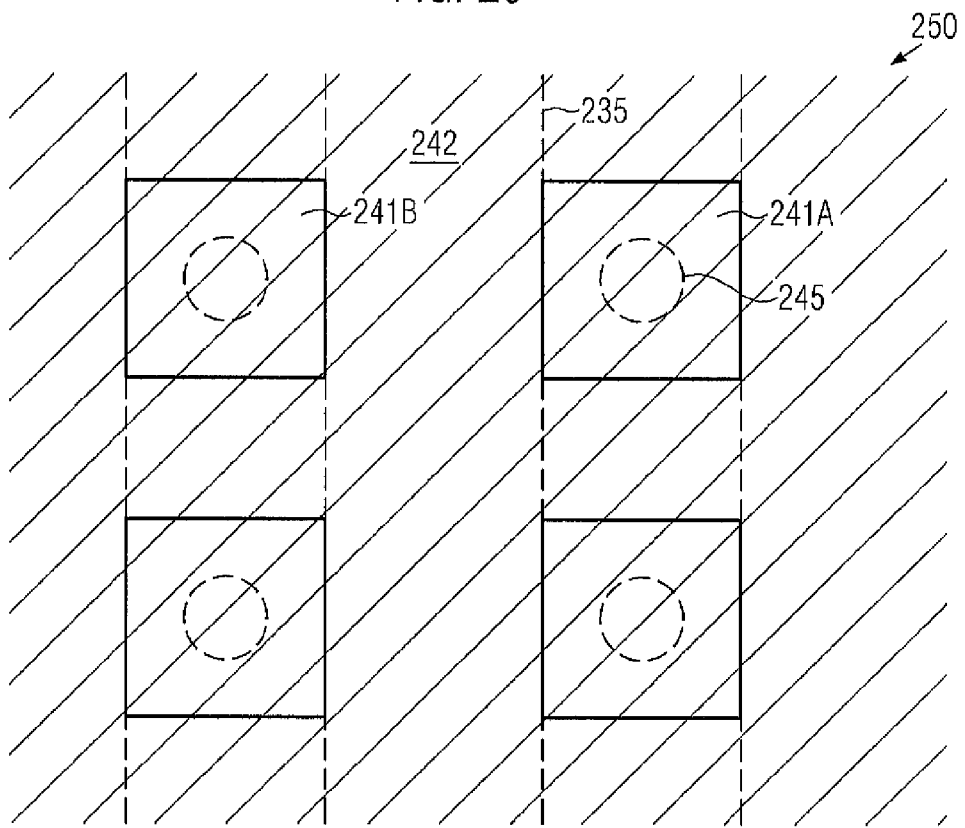

FIG. 2d schematically illustrates a top view of the semiconductor die 250. As illustrated, the plurality of isolated material portions 241A, 241B may be positioned so as to be aligned with the vias 245 and the metal lines 235, wherein the size of the portions 241A, 241B may be selected so as to avoid any misalignments upon forming openings for the vias 245. The isolated material portions 241A, 241B may be formed by depositing a continuous layer and patterning the same on the basis of appropriate lithography processes, wherein the etch stop layer 242 may be used as an efficient etch stop material.

Figure 2E:
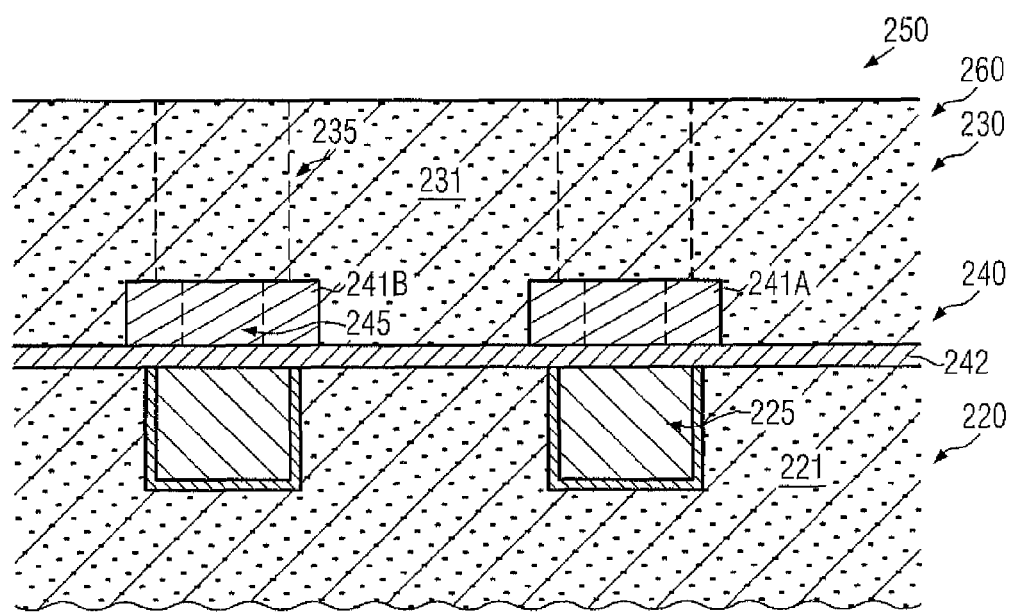
FIG. 2e schematically illustrates a cross-sectional view of the semiconductor die in a further advanced manufacturing stage in which an ultra low-k dielectric material of a metal line layer may engage with dielectric material portions of superior mechanical stability of a via layer, according to illustrative embodiments.

FIG. 2e schematically illustrates the semiconductor die 250 in a further advanced manufacturing stage. As shown, the ULK material 231 of the metal line layer 230 may be provided and may also be formed in the via layer 240 between the isolated material portions 241a, 241b. Consequently, the ULK material may efficiently connect to the material portions 241A, 241B due to increased surface area provided by the portions 241A, 241B, thereby providing a "teethed" configuration, in which the materials 241A, 241B and the ULK material 231 may engage with each other. The ULK material 231 may be formed on the basis of any appropriate deposition regime in combination with additional treatments, as discussed above, wherein, if required, an additional mild planarization process may be applied so as to obtain a planar surface topography. Thereafter, the material 231 and the material portions 241A, 241B may be patterned on the basis of appropriate lithography processes and etch processes, similarly as may be applied in the embodiments previously described with reference to FIGS. 2a and 2b.

Figure 2F:
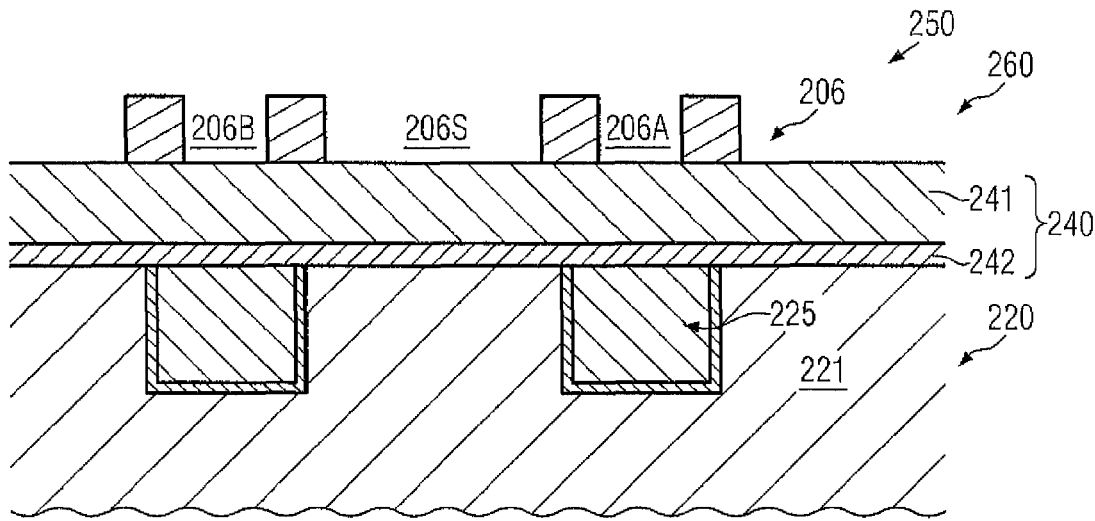
FIGS. 2f-2g schematically illustrate a cross-sectional view and a top view, respectively, of the semiconductor device when patterning via holes in isolated dielectric material portions of superior mechanical stability prior to depositing a ULK material, according to illustrative embodiments.

FIG. 2f schematically illustrates the semiconductor die 250 according to further illustrative embodiments. As illustrated, the dielectric material 241 of superior mechanical stability may be provided above the etch stop layer 242 and an etch mask 206 may be formed above the layer 241. The etch mask 206 may be comprised of any appropriate material, such as a resist material, a hard mask material and the like, and may have formed therein appropriate mask openings 206A, 206B, which may define the lateral size and position of vias to be formed in the layer 240. Furthermore, the etch mask 206 may comprise openings 206S so as to define the lateral position and size of locations in which a ULK material may be provided within the via layer 240.

Figure 2G:
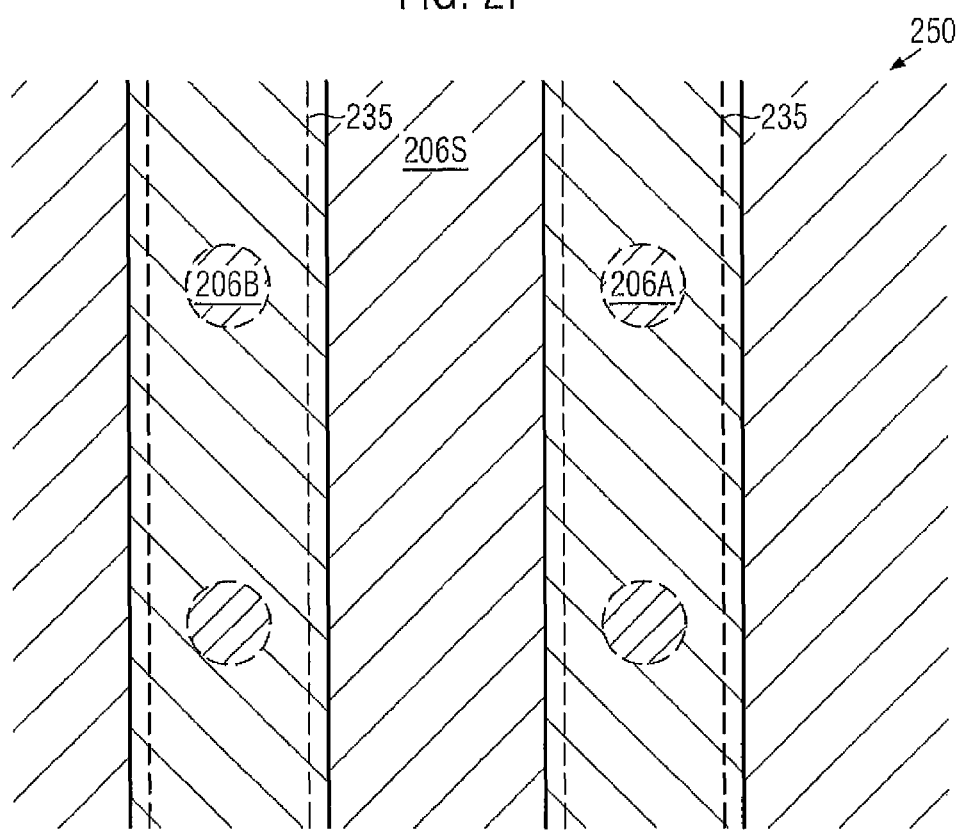

FIG. 2g schematically illustrates a top view of the semiconductor die 250, wherein the position and shape of the mask openings 206A, 206B is illustrated in combination with the mask opening 206S. In the embodiment shown, also the position of the metal lines 235 are illustrated in dashed lines such that the spacings 206S are appropriate aligned with the metal lines 235. In this manner, openings for the vias may be formed on the basis of a single lithography step and also metal lines 235 may be formed on the basis of a single lithography step without requiring any additional lithography process for patterning the layer 241 (FIG. 2f).

Figure 2H:
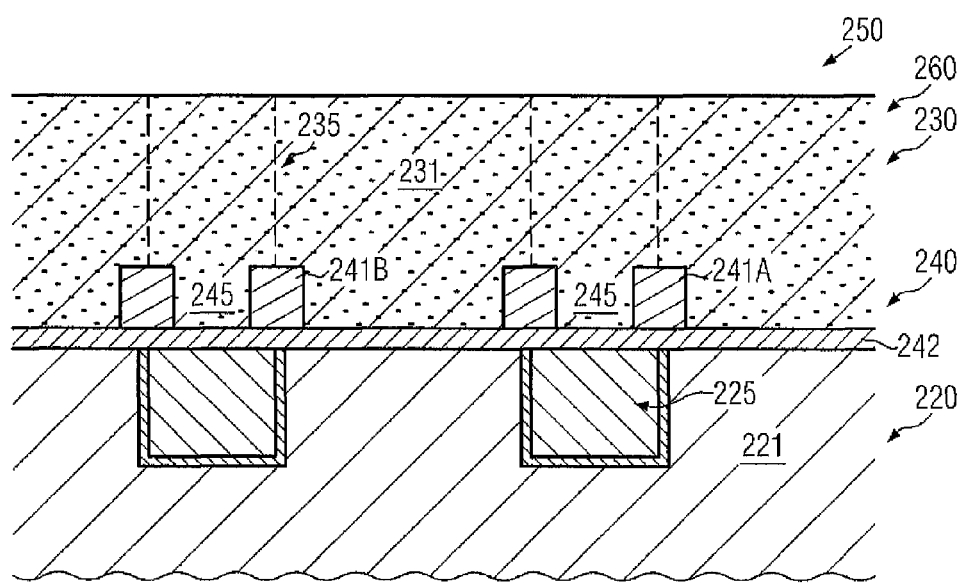
FIG. 2h schematically illustrates a cross-sectional view of the semiconductor device of FIGS. 2f and 2g in a further advanced manufacturing stage according to still further illustrative embodiments.

FIG. 2h schematically illustrates a cross-sectional view of the semiconductor die 250 in a further advanced manufacturing stage. As illustrated, the via layer 240 comprises the isolated material portions 241A, 241B, each of which may comprise an opening for the via 245, which, in the manufacturing stage shown, may be filled with the ULK material 231 of the metal line layer 230. Similarly, the spacing between the material portions 241A, 241B may also be filled with the ULK material 231. To this end, the dielectric material 241 (FIG. 2f) may be patterned on the basis of the etch mask 206 (FIG. 2f) by applying any appropriate etch recipe, wherein the material 242 may act as an efficient etch stop material. Thereafter, the etch mask 206 (FIG. 2f) may be removed and the further processing may be continued by forming the ULK material 231, which may be accomplished by depositing an appropriate base material and treating the base material so as to obtain the desired final dielectric constant. It should be appreciated that, also in this case, a further planarization process may be applied, if required. In other cases, the base material may be applied in a low viscous state, thereby reliably filling any openings in the via layer 240 while still providing a planar surface topography. Thereafter, the processing may be continued by providing a further etch mask (not shown) to define the lateral size and position of the metal lines 235, as indicated by the dashed lines, and an appropriate etch process may be performed to etch through the material 231, wherein the isolated portions 241A, 241B, which are appropriately adapted in size and position to the metal lines 235, as previously explained with reference to FIG. 2g, may act as efficient etch stop material so that the material 231 within the via openings in the portions 241A, 241B may be efficiently removed. Thereafter, the etch stop material 242 may be etched on the basis of any well-established etch recipes.

Consequently, on the basis of the embodiments described with reference to FIGS. 2c-2h, the amount of mechanically stable dielectric material in the via layer may be increased, while still preserving a significant portion of ULK material therein. The dielectric material of superior mechanical stability may be provided such that the vias may be fully laterally embedded therein, thereby also providing an increased surface portion for connecting to the ULK material, which may thus result in superior overall adhesion, thereby also reducing the probability of creating damage upon performing a reflow process on the basis of a lead-free contact regime.

As a result, the present disclosure provides manufacturing techniques and semiconductor devices in which sophisticated metallization systems comprising ULK material in metal line layers may be provided with via layers of superior mechanical integrity without unduly reducing electrical performance of the entire metallization system. Due to the superior mechanical stability of the via layers, sophisticated lead-free contact regimes may be applied in order to directly connect a contact structure of the semiconductor die with a complementary contact structure of a package substrate. In some illustrative embodiments, the vias may be fully embedded in the dielectric material of superior mechanical integrity on the basis of isolated material portions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a metallization system comprising a metal line layer formed above a substrate, said metal line layer comprising a metal line laterally embedded in a porous dielectric material, said metallization system further comprising a via layer comprising a via connecting to said metal line, said via being laterally embedded in a non-porous dielectric material along a height of said via, wherein said non-porous dielectric material comprises an etch stop layer and at least one further material formed at least locally at said via above said etch stop layer and wherein said at least one further material forms material portions, each of which is laterally embedded in a further porous dielectric material; and
a bump structure configured to be connected to a complementary contact structure of a package substrate by using a lead-free solder material.

2. The semiconductor device of claim 1, wherein said porous dielectric material has a dielectric constant of 2.7 or less.

3. The semiconductor device of claim 1, wherein said metallization system comprises a plurality of via layers comprising vias that are laterally embedded in a non-porous dielectric material, wherein each of said via layers is formed between metal line layers comprising a porous dielectric material.

4. The semiconductor device of claim 1, wherein said at least one further material forms a continuous layer outside of said via and any other via of said via layer.

5. The semiconductor device of claim 1, wherein said further porous dielectric material and said porous dielectric material of said metal line layer form a continuous material.

6. The semiconductor device of claim 1, wherein said bump structure comprises metal pillars.

7. The semiconductor device of claim 1, wherein said bump structure comprises solder bumps comprised of a lead-free solder material.

8. The semiconductor device of claim 1, further comprising circuit elements having a critical dimension of approximately 50 nm or less.

9. A semiconductor device, comprising:
a plurality of stacked metal line layers formed above a substrate, each metal line layer comprising a plurality of metal lines formed in an ultra low-k dielectric material;
at least one intermediate via layer located between two of said plurality of stacked metal line layers, said at least one intermediate via layer comprising a metal-containing via formed in a dielectric material, at least a portion of which has a greater dielectric constant than said ultra low-k dielectric material, said at least a portion extending along a total height of said via, wherein said dielectric material of greater dielectric constant forms a plurality of material portions, each of which is laterally enclosed by an ultra low-k dielectric material; and
a bump structure comprising contact elements for forming an intermetallic connection with complementary contact elements of a package substrate on the basis of a lead-free contact regime wherein said plurality of material are positioned on an etch stop layer.

10. The semiconductor device of claim 9, wherein said dielectric material of greater dielectric constant forms a continuous material layer outside said metal-containing via and any other via of said at least one via layer.

11. The semiconductor device of claim 9, wherein a dielectric constant of said ultra low-k dielectric material is 2.7 or less.

12. The semiconductor device of claim 9, wherein said at least one intermediate via layer comprises a nitrogen-containing etch stop layer.

* * * * *